United States Patent
Harada et al.

(10) Patent No.: US 10,277,237 B2
(45) Date of Patent: Apr. 30, 2019

(54) SUCCESSIVE APPROXIMATION TYPE A/D CONVERSION CIRCUIT

(71) Applicant: OLYMPUS CORPORATION, Hachioji-shi, Tokyo (JP)

(72) Inventors: Yasunari Harada, Ebina (JP); Shuzo Hiraide, Tokyo (JP); Masato Osawa, Tokyo (JP); Hideki Kato, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 16/043,920

(22) Filed: Jul. 24, 2018

(65) Prior Publication Data

US 2018/0331688 A1 Nov. 15, 2018

Related U.S. Application Data

(63) Continuation of application No. PCT/JP2016/059807, filed on Mar. 28, 2016.

(51) Int. Cl.
*H03M 1/38* (2006.01)
*H03M 1/00* (2006.01)
(Continued)

(52) U.S. Cl.
CPC .............. *H03M 1/002* (2013.01); *H03M 1/38* (2013.01); *H03M 1/74* (2013.01); *H03M 1/00* (2013.01);
(Continued)

(58) Field of Classification Search
CPC .......... H03M 1/00; H03M 1/12; H03M 1/001; H03M 1/10
(Continued)

(56) References Cited

U.S. PATENT DOCUMENTS

| 5,248,974 A | 9/1993 | Fattaruso et al. |
| 2014/0145868 A1 | 5/2014 | Sugimoto et al. |
| 2018/0097535 A1* | 4/2018 | Gordon ................ H04B 1/16 |

FOREIGN PATENT DOCUMENTS

| JP | 6-177765 A | 6/1994 |
| JP | 2014-107674 A | 6/2014 |

(Continued)

OTHER PUBLICATIONS

Harpe et al., "A 26 µW 8 bit 10 MS/s Asynchronous SAR ADC for Low Energy Radios", IEEE Journal of Solid-State Circuits, Jul. 2011, vol. 46, No. 7, pp. 1585-1595, (11 pages).

(Continued)

*Primary Examiner* — Joseph J Lauture
(74) *Attorney, Agent, or Firm* — Westerman, Hattori, Daniels & Adrian, LLP

(57) ABSTRACT

A successive approximation type A/D conversion circuit includes a first capacitor circuit, a second capacitor circuit, a plurality of comparison circuits, a determination circuit, and a control circuit. The determination circuit counts a first number of first state and a second number of second state with respect to a plurality of first digital signals output from the plurality of comparison circuits. The determination circuit outputs a control signal for stopping the plurality of comparison circuits to the control circuit when an absolute value of a difference between the first number and the second number is equal to or smaller than 1. The control circuit stops the plurality of comparison circuits on the basis of the control signal.

3 Claims, 8 Drawing Sheets

(51) Int. Cl.
  *H03M 1/74* (2006.01)
  *H03M 1/12* (2006.01)
  *H03M 1/10* (2006.01)

(52) U.S. Cl.
  CPC .............. *H03M 1/001* (2013.01); *H03M 1/10* (2013.01); *H03M 1/12* (2013.01)

(58) Field of Classification Search
  USPC .......................... 341/161, 155, 158, 110, 120
  See application file for complete search history.

(56) References Cited

FOREIGN PATENT DOCUMENTS

| JP | 2015-211391 A | 11/2015 |
|---|---|---|
| JP | 2015-233226 A | 12/2015 |

OTHER PUBLICATIONS

International Search Report dated May 31, 2016, issued in counterpart International Application No. PCT/JP2016/059807, w/English translation (4 pages).

* cited by examiner

SUCCESSIVE APPROXIMATION TYPE A/D CONVERSION CIRCUIT

This application is a continuation application based on International Patent Application No. PCT/JP2016/059807, filed on Mar. 28, 2016, the content of which is incorporated herein by reference.

BACKGROUND OF THE INVENTION

Field of the Invention

The present invention relates to a successive approximation type A/D conversion circuit.

Description of Related Art

There are A/D conversion circuits that realize high speed, high precision, and low power consumption. For example, a successive approximation type A/D conversion circuit using a differential input asynchronous scheme disclosed in Reference Document below is known. In such a successive approximation type A/D conversion circuit, an analog signal input as a differential signal is held in a sample-and-hold circuit. A reference signal is reflected in the analog signal held by the sample-and-hold circuit via a capacitor circuit, and accordingly, a comparison voltage signal is generated. On the basis of the comparison voltage signal, the successive approximation logic circuit determines a value of each bit from an MSB to an LSB of a digital signal corresponding to the differential signal in accordance with a binary search algorithm. The determined value of each bit is fed back to the reference signal. The value of each bit is 0 or 1.

REFERENCE DOCUMENT

"A 26 µW 8 bit 10 MS/s Asynchronous SAR ADC for Low Energy Radios," IEEE JOURNAL OF SOLID-STATE CIRCUITS, Vol. 46, No. 7, July 2011, pp 1585-1595

Most of the successive approximation type A/D conversion circuit can be constituted by a digital circuit without using an analog circuit such as an operational amplifier. Therefore, high speed, high precision, and low power consumption of the successive approximation type A/D conversion circuit can be realized relatively easily by using a fine complementary metal oxide semiconductor (CMOS) process. In view of this, successive approximation type A/D conversion circuits are widely used for, for example, image sensors and system large scale integrations (LSIs) for mobile devices.

SUMMARY OF THE INVENTION

According to a first aspect of the present invention, a successive approximation type A/D conversion circuit includes a first capacitor circuit, a second capacitor circuit, a plurality of comparison circuits, a determination circuit, and a control circuit. The first capacitor circuit includes a plurality of first capacitors having weighted capacitance values. A first analog signal is input to the first capacitor circuit. The second capacitor circuit includes a plurality of second capacitors having weighted capacitance values. A second analog signal is input to the second capacitor circuit. The first analog signal and the second analog signal constitute a differential signal. The plurality of comparison circuits are connected to a first output node of the first capacitor circuit and a second output node of the second capacitor circuit. The plurality of comparison circuits compare a potential of the first output node with a potential of the second output node, and output a first digital signal. The first digital signal indicates any one of a first state and a second state. The potential of the first output node is higher than the potential of the second output node in the first state. The potential of the first output node is lower than the potential of the second output node in the second state. The determination circuit counts a number of at least one of the first state and the second state with respect to the plurality of first digital signals output from the plurality of comparison circuits and generates a second digital signal indicating a comparison result on the basis of the counted number. The control circuit generates a third digital signal corresponding to the first analog signal and the second analog signal on the basis of the second digital signal, and controls the first capacitor circuit or the second capacitor circuit on the basis of the second digital signal. The determination circuit counts a first number of the first state and a second number of the second state with respect to the plurality of first digital signals output from the plurality of comparison circuits. The determination circuit outputs a control signal for stopping the plurality of comparison circuits to the control circuit when an absolute value of a difference between the first number and the second number is equal to or smaller than 1. The control circuit stops the plurality of comparison circuits on the basis of the control signal.

According to a second aspect of the present invention, in the first aspect, the plurality of comparison circuits may be an odd number of three or more comparison circuits.

According to a third aspect of the present invention, in the first aspect, the determination circuit may generate the second digital signal indicating a state corresponding to a number that becomes equal to or greater than 2 earlier between the first number and the second number.

DETAILED DESCRIPTION OF THE INVENTION

Embodiments of the present invention will be described with reference to the drawings.

First Embodiment

Figure 1:
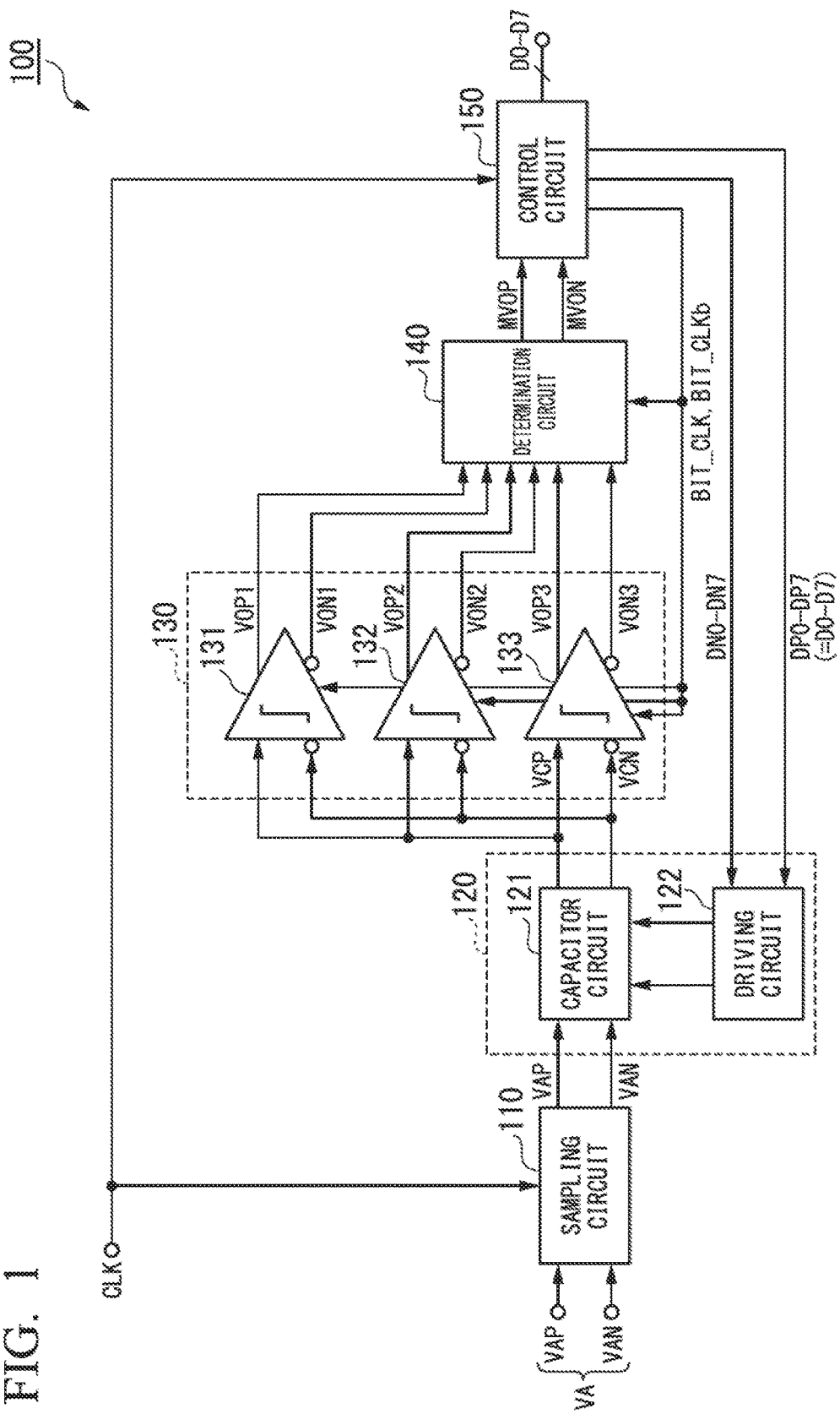
FIG. 1 is a block diagram showing a configuration of an A/D conversion circuit according to a first embodiment of the present invention.

FIG. 1 shows a configuration of an A/D conversion circuit 100 according to a first embodiment of the present invention. The A/D conversion circuit 100 is a successive approximation type A/D conversion circuit. As shown in FIG. 1, the A/D conversion circuit 100 includes a sampling circuit 110, a capacitance DAC circuit 120, a parallel comparison circuit 130, a determination circuit 140, and a control circuit 150.

The sampling circuit 110 performs tracking and holding of a pair of an analog signal VAP and an analog signal VAN constituting a differential signal VA. Further, the sampling circuit 110 samples the analog signal VAP and the analog signal VAN into the capacitance DAC circuit 120 to take the analog signal VAP and the analog signal VAN into the A/D conversion circuit 100. An operation of the sampling circuit 110 is controlled on the basis of the clock signal CLK.

The capacitance DAC circuit 120 holds the analog signal VAP and the analog signal VAN sampled by the sampling circuit 110. The capacitance DAC circuit 120 generates a reference signal on the basis of a digital signal that is generated by the control circuit 150. The capacitance DAC circuit 120 subtracts the reference signal from each of the analog signal VAP and the analog signal VAN sampled by the sampling circuit 110. Accordingly, the capacitance DAC circuit 120 acquires a cumulative residual between the differential signal VA and an 8-bit digital signal. The capacitance DAC circuit 120 outputs a subtraction result obtained by subtracting the reference signal from the analog signal VAP and the analog signal VAN as an analog signal VCP and an analog signal VCN to the parallel comparison circuit 130. The analog signal VCP and the analog signal VCN are signals in which the cumulative residual has been reflected.

The parallel comparison circuit 130 includes a plurality of comparison circuits. In the A/D conversion circuit 100 of the first embodiment, the plurality of comparison circuits are an odd number of three or more comparison circuits. The parallel comparison circuit 130 shown in FIG. 1 includes three comparison circuits 131, 132, and 133. As shown in the third embodiment, the number of comparison circuits included in the parallel comparison circuit 130 may be an even number. The comparison circuits 131, 132, and 133 are connected to the capacitance DAC circuit 120 and the determination circuit 140.

The comparison circuits 131, 132, and 133 include a first input terminal (a non-inverting input terminal), a second input terminal (an inverting input terminal), a first output terminal (a non-inverting output terminal), and a second output terminal (an inverting output terminal). The first input terminal and the second input terminal of the comparison circuits 131, 132, and 133 are connected to the capacitance DAC circuit 120. The analog signal VCP and the analog signal VCN output from the capacitance DAC circuit 120 are input to the comparison circuits 131, 132, and 133. The analog signal VCP is input to the first input terminals of the comparison circuits 131, 132, and 133, and the analog signal VCN is input to the second input terminals of the comparison circuits 131, 132, and 133. The comparison circuits 131, 132, and 133 compare a potential of the analog signal VCP with a potential of the analog signal VCN. The comparison circuits 131, 132, and 133 output digital signals VOP1, VOP2, and VOP3 based on comparison results from the first output terminals and output digital signals VON1, VON2, and VON3 based on the comparison results from the second output terminals.

Specifically, when a signal level of the analog signal VCP is higher than a signal level of the analog signal VCN, the comparison circuits 131, 132, and 133 output high level ("H") signals as the digital signals VOP1, VOP2, and VOP3 and output low level ("L") signals as the digital signals VON1, VON2, and VON3. When the signal level of the analog signal VCP is lower than the signal level of the analog signal VCN, the comparison circuits 131, 132, and 133 output low level signals as the digital signals VOP1, VOP2, and VOP3 and output high level signals as the digital signals VON1, VON2, and VON3. Operations of the comparison circuits 131, 132, and 133 are controlled on the basis of an internal clock signal BIT_CLK and an inverted internal clock signal BIT_CLKb generated by the control circuit 150.

One set of digital signals output from one comparison circuit indicates a comparison result of the comparison circuit. The set of digital signals output from the comparison circuit 131 are the digital signal VOP1 and the digital signal VON1. The set of digital signals output from the comparison circuit 132 are the digital signal VOP2 and the digital signal VON2. The set of digital signals output from the comparison circuit 133 are the digital signal VOP3 and the digital signal VON3. A set of digital signals indicates one of two states. The two states are a first state and a second state. In the first state, the signal level of the analog signal VCP is higher than the signal level of the analog signal VCN. In the second state, the signal level of the analog signal VCP is lower than the signal level of the analog signal VCN.

The determination circuit 140 includes six input terminals, a first output terminal, and a second output terminal. Each input terminal of the determination circuit 140 is connected to any one of the first output terminal and the second output terminal of the comparison circuits 131, 132, and 133. The respective digital signals output from the comparison circuits 131, 132, and 133 are input to respective input terminals of the determination circuit 140. The first output terminal and the second output terminal of the determination circuit 140 are connected to the control circuit 150. The determination circuit 140 counts the number of at least one of the first state and the second state with respect to the digital signals VOP1, VOP2, and VOP3 and the digital signals VON1, VON2, and VON3 output from the comparison circuits 131, 132, and 133. The determination circuit 140 generates a digital signal MVOP and a digital signal MVON indicating a comparison result on the basis of the counted number. The determination circuit 140 outputs the digital signal MVOP from the first output terminal and outputs the digital signal MVON from the second output terminal.

Specifically, the determination circuit 140 counts a first number of the first state and a second number of the second state of the three sets of digital signals output from the three comparison circuits 131, 132, and 133. The determination circuit 140 generates the digital signal MVOP and the digital signal MVON indicating states corresponding to the greater number between the first number and the second number. For example, when the first number is greater than the second number, the determination circuit 140 generates the digital signal MVOP and the digital signal MVON indicating the first state. When the second number is greater than the first number, the determination circuit 140 generates the digital signal MVOP and the digital signal MVON indicating the second state. That is, the determination circuit 140 functions as a majority determination circuit. The operation of the determination circuit 140 is controlled on the basis of the internal clock signal BIT_CLK and the inverted internal clock signal BIT_CLKb generated by the control circuit 150.

The control circuit 150 includes a first input terminal, a second input terminal, and an output terminal. The first input terminal of the control circuit 150 is connected to the first output terminal of the determination circuit 140. The second input terminal of the control circuit 150 is connected to the second output terminal of the determination circuit 140. The digital signal MVOP is input to the first input terminal of the control circuit 150 and the digital signal MVON is input to the second input terminal of the control circuit 150. The control circuit 150 generates digital signals D0 to D7 of A/D conversion results based on the digital signal MVOP and the digital signal MVON from the determination circuit 140. The control circuit 150 outputs the digital signals D0 to D7 from the output terminal. The digital signals D0 to D7 are output to a circuit at a subsequent stage of the A/D conversion circuit 100 as the A/D conversion result. The A/D conversion circuit 100 is an A/D conversion circuit with an 8-bit output, but the present invention is not limited to this example. The number of output bits of the A/D conversion circuit 100 can be arbitrarily set.

The control circuit 150 functions as a successive approximation register (SAR) logic circuit. The control circuit 150 sequentially determines a value of each bit of the digital signals DP0 to DP7 and the digital signals DN0 to DN7 corresponding to the digital signal MVOP and the digital signal MVON indicating the comparison result in accordance with a binary search algorithm. The control circuit 150 supplies the digital signals DP0 to DP7 and the digital signals DN0 to DN7 corresponding to the digital signal MVOP and the digital signal MVON to the capacitance DAC circuit 120. The control circuit 150 outputs the digital signals DP0 to DP7 as digital signals D0 to D7 indicating the result of the A/D conversion. The control circuit 150 generates the internal clock signal BIT_CLK and the inverted internal clock signal BIT_CLKb for controlling the parallel comparison circuit 130 and the determination circuit 140. The control circuit 150 supplies the generated internal clock signal BIT_CLK and the generated inverted internal clock signal BIT_CLKb to the parallel comparison circuit 130 and the determination circuit 140. The operation of the control circuit 150 is controlled on the basis of the clock signal CLK. The control circuit 150 generates the internal clock signal BIT_CLK and the inverted internal clock signal BIT_CLKb in a period in which the clock signal CLK is at the high level.

The capacitance DAC circuit 120 includes a capacitor circuit 121 and a driving circuit 122. The capacitor circuit 121 subtracts the reference signal from the analog signal VAP and the analog signal VAN using charge redistribution among a plurality of capacitances. As a result, the capacitor circuit 121 obtains the analog signal VCP and the analog signal VCN indicating the cumulative residual. The driving circuit 122 drives the capacitor circuit 121 by generating a reference signal on the basis of the digital signals DP0 to DP7 and the digital signals DN0 to DN7 input from the control circuit 150.

The A/D conversion circuit 100 sequentially obtains the A/D conversion result bit by bit from the most significant bit (D7) to the least significant bit (D0) of the digital signals D0 to D7. In this A/D conversion, each time the subtraction is performed by the capacitor circuit 121 of the capacitance DAC circuit 120, the comparison circuits 131, 132, and 133 compare the voltage of the analog signal VCP in which the cumulative residual has been reflected with the voltage of the analog signal VCN.

Figure 2:
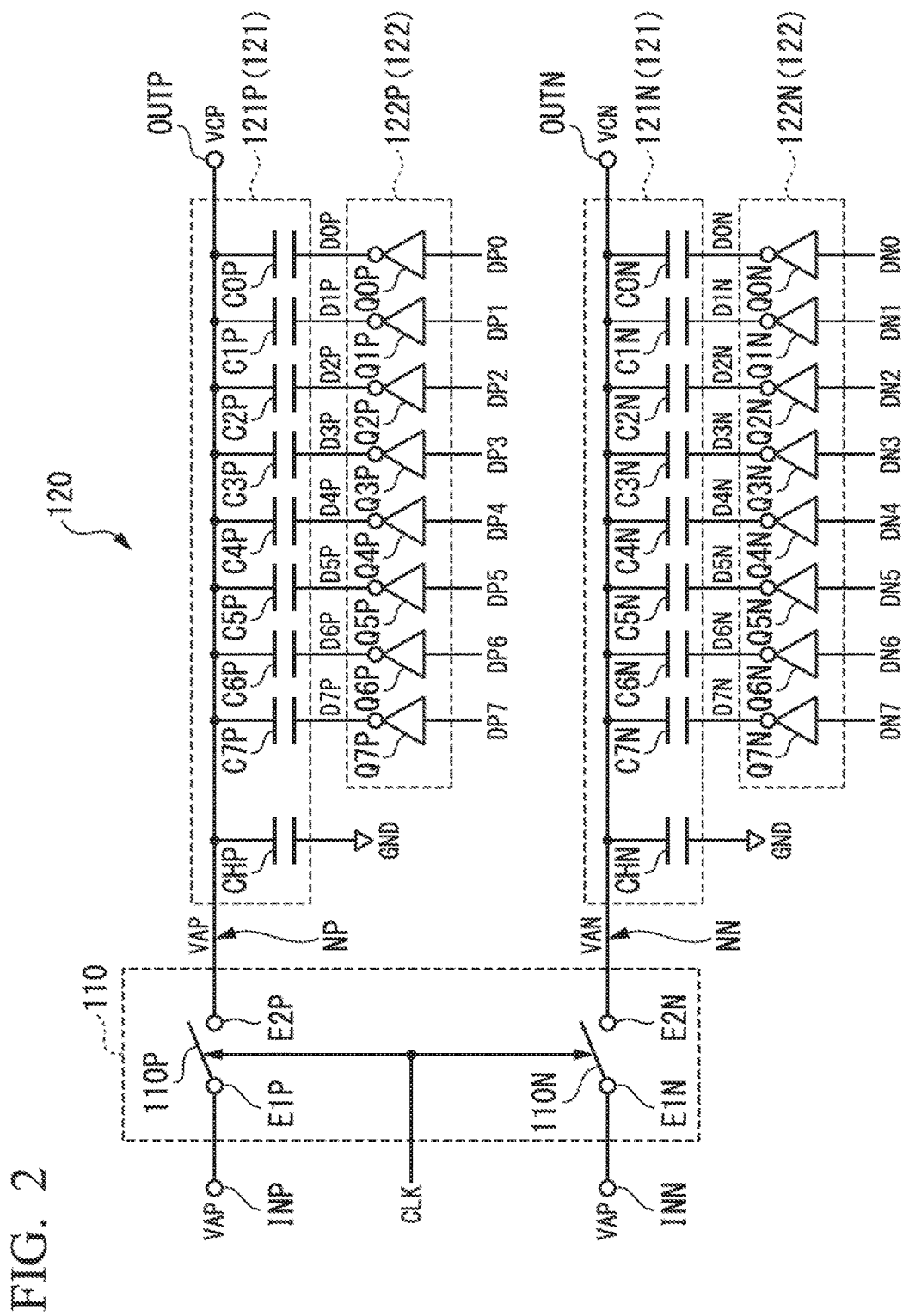
FIG. 2 is a circuit diagram showing a configuration of a sampling circuit and a capacitance DAC circuit according to the first embodiment of the present invention.

FIG. 2 shows a configuration of the sampling circuit 110 and the capacitance DAC circuit 120. The sampling circuit 110 includes a switch 110P and a switch 110N. Each switch has a first terminal and a second terminal. A state of each switch is switched between on and off.

A first terminal E1P of the switch 110P is connected to a non-inverting input terminal INP to which the analog signal VAP is input. A second terminal E2P of the switch 110P is connected to a node NP of the capacitance DAC circuit 120. When the switch 110P is on, the first terminal E1P and the second terminal E2P of the switch 110P are connected to each other. In this case, the analog signal VAP is input to the node NP of the capacitance DAC circuit 120. When the switch 110P is off, a high impedance state is established between the first terminal E1P and the second terminal E2P of the switch 110P. The switch 110P samples the analog signal VAP. When the switch 110P is switched from on to off, the analog signal VAP is held in a capacitor unit 121P to be described below. On and off of the switch 110P are switched on the basis of the clock signal CLK.

A first terminal E1N of the switch 110N is connected to an inverting input terminal INN to which the analog signal VAN is input. A second terminal E2N of the switch 110N is connected to a node NN of the capacitance DAC circuit 120. When the switch 110N is on, the first terminal E1N and the second terminal E2N of the switch 110N are connected to each other. In this case, the analog signal VAN is input to the node NN of the capacitance DAC circuit 120. When the switch 110N is off, a high impedance state is established between the first terminal E1N and the second terminal E2N of the switch 110N. The switch 110N samples the analog signal VAN. When the switch 110N is switched from on to off, the analog signal VAN is held in a capacitor unit 121N to be described below. On and off of the switch 110N are switched on the basis of the clock signal CLK.

The capacitor circuit 121 constituting the capacitance DAC circuit 120 includes a capacitor unit 121P (a first capacitor circuit) and a capacitor unit 121N (a second capacitor circuit). The capacitor unit 121P includes an attenuation capacitor CHP and binary capacitors C0P to C7P (first capacitors). Each of the capacitors includes a first terminal and a second terminal. The first terminal of the attenuation capacitor CHP is connected to the node NP. The second terminal of the attenuation capacitor CHP is connected to a ground GND. The first terminals of the binary capacitors C0P to C7P are connected to the node NP. The second terminals of the binary capacitors C0P to C7P are connected to the driving unit 122P constituting the driving circuit 122. The attenuation capacitor CHP and the binary capacitors C0P to C7P hold the analog signal VAP sampled by the switch 110P of the sampling circuit 110.

The binary capacitors C0P to C7P are arranged to correspond to the digital signals DP0 to DP7 generated by the control circuit 150. The capacitance values of the respective binary capacitors C0P to C7P are different. For example, the capacitance value of the binary capacitor C(n+1)P corresponding to the digital signal DP(n+1) is twice the capacitance value of the binary capacitor CnP corresponding to the digital signal DPn. n is an integer from 0 to 6. The capacitance values of the binary capacitors C0P to C7P are weighted by binary numbers corresponding to the bits of the digital signals DP0 to DP7, respectively.

The capacitor unit 121N includes an attenuation capacitor CHN and binary capacitors C0N to C7N (second capacitors). Each of the capacitors includes a first terminal and a second terminal. The first terminal of the attenuation capacitor CHN is connected to the node NN. The second terminal of the attenuation capacitor CHN is connected to the ground GND. The first terminals of the binary capacitors C0N to C7N are connected to the node NN. The second terminals of the binary capacitors C0N to C7N are connected to the driving unit 122N constituting the driving circuit 122. The attenuation capacitor CHN and the binary capacitors C0N to C7N hold the analog signal VAN sampled by the switch 110N of the sampling circuit 110.

The binary capacitors C0N to C7N are arranged to correspond to the digital signals DN0 to DN7 generated by the control circuit 150. Capacitance values of the binary capacitors C0N to C7N are different. The capacitance values of the binary capacitors C0N to C7N are weighted by binary numbers corresponding to respective bits of the digital signals DN0 to DN7, similar to the binary capacitors C0P to C7P.

The driving circuit 122 constituting the capacitance DAC circuit 120 includes a driving unit 122P and a driving unit 122N. The driving unit 122P includes inverters Q0P to Q7P. A first power supply voltage VDD1 (not shown) is supplied to the inverters Q0P to Q7P. Therefore, amplitudes of the reference signals D0P to D7P output from the respective inverters Q0P to Q7P are equal to the first power supply voltage VDD1. The inverters Q0P to Q7P are arranged to correspond to digital signals DP0 to DP7 generated by the control circuit 150. The inverters Q0P to Q7P include an input terminal and an output terminal. Respective bits of the digital signals DP0 to DP7 are input from the control circuit 150 to the input terminals of the inverters Q0P to Q7P. The output terminals of the inverters Q0P to Q7P are connected to the second terminals of the binary capacitors C0P to C7P.

The inverters Q0P to Q7P generate the reference signals D0P to D7P by inverting the digital signals DP0 to DP7 output from the control circuit 150. The plurality of binary capacitors C0P to C7P included in the capacitor unit 121P extract charge based on the reference signals D0P to D7P from charge based on the analog signal VAP held in the attenuation capacitor CHP through charge redistribution. Accordingly, the binary capacitors C0P to C7P subtract the reference signals D0P to D7P from the analog signal VAP. The capacitor unit 121P outputs the analog signal VCP that is a subtraction result to the node NP.

The driving unit 122N includes inverters Q0N to Q7N. The first power supply voltage VDD1 (not shown) is supplied to the inverters Q0N to Q7N. Therefore, amplitudes of the reference signals D0N to D7N output from the respective inverters Q0N to Q7N are equal to the first power supply voltage VDD1. The inverters Q0N to Q7N are arranged to correspond to digital signals DN0 to DN7 generated by the control circuit 150. The inverters Q0N to Q7N include an input terminal and an output terminal. Respective bits of the digital signals DN0 to DN7 are input from the control circuit 150 to the input terminals of the inverters Q0N to Q7N. The output terminals of the inverters Q0N to Q7N are connected to the second terminals of the binary capacitors C0N to C7N.

The inverters Q0N to Q7N generate the reference signals D0N to D7N by inverting the digital signals DN0 to DN7 output from the control circuit 150. The plurality of binary capacitors C0N to C7N of the capacitor unit 121N extract charge based on the reference signals D0N to D7N from the charge based on the analog signal VAN held in the attenuation capacitor CHN through charge redistribution. Accordingly, the binary capacitors C0N to C7N subtract the reference signals D0N to D7N from the analog signal VAN. The capacitor unit 121N outputs the analog signal VCN which is a subtraction result to the node NN.

The node NP is connected to the second terminal E2P of the switch 110P, the first terminal of the attenuation capacitor CHP, and the first terminal of the binary capacitors C0P to C7P. The node NP is an arbitrary position on a signal line electrically connected to the terminals. The node NP constitutes a first input node and a first output node of the capacitor unit 121P. A voltage of the node NP is output as the analog signal VCP. The node NN is connected to the second terminal E2N of the switch 110N, the first terminal of the attenuation capacitor CHN, and the first terminal of the binary capacitors C0N to C7N. The node NN is an arbitrary position on a signal line electrically connected to the terminals. The node NN constitutes a second input node and a second output node of the capacitor unit 121N. A voltage of the node NN is output as the analog signal VCN.

Figure 3:
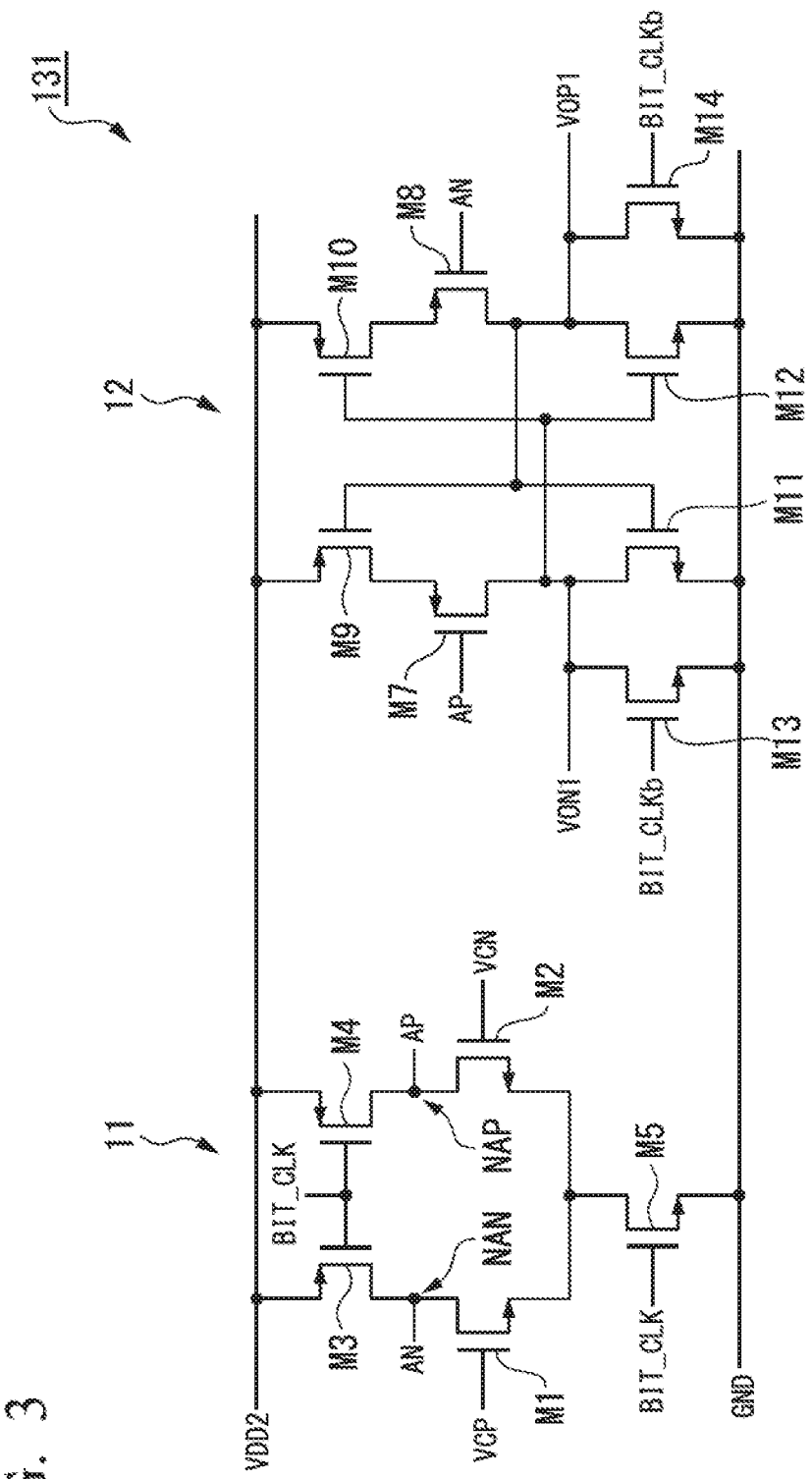
FIG. 3 is a circuit diagram showing a configuration of a comparison circuit according to the first embodiment of the present invention.

FIG. 3 shows a configuration of the comparison circuit 131 constituting the parallel comparison circuit 130. Since the comparison circuits 131, 132, and 133 include the same configuration, the configuration of the comparison circuit 131 will be described as a representative. As shown in FIG. 3, the comparison circuit 131 includes a differential amplifier circuit 11 and a latch circuit 12.

The differential amplifier circuit 11 includes a transistor M1, a transistor M2, a transistor M3, a transistor M4, and a transistor M5. The transistor M1, the transistor M2, and the transistor M5 are N-channel type field effect transistors. The transistor M3 and the transistor M4 are P-channel type field effect transistors. The type of each transistor constituting the differential amplifier circuit 11 can be optionally selected under a condition that an amplification function of the differential amplifier circuit 11 can be obtained.

A gate terminal of the transistor M1 is connected to a first input terminal. A gate terminal of the transistor M2 is connected to a second input terminal. The first input terminal and the second input terminal are differential input terminals to which the analog signal VAP and the analog signal VAN which are differential signals are input. The analog signal VCP is input from the capacitance DAC circuit 120 to the gate terminal of the transistor M1 via the first input terminal. The analog signal VCN is input from the capacitance DAC circuit 120 to the gate terminal of the transistor M2 via the second input terminal.

A source terminal of the transistor M3 is connected to a power supply that outputs a second power supply voltage VDD2. A drain terminal of the transistor M3 is connected to a drain terminal of the transistor M1. A source terminal of the transistor M4 is connected to the power supply that outputs the second power supply voltage VDD2. A drain terminal of the transistor M4 is connected to a drain terminal of the transistor M2. A gate terminal of the transistor M4 is connected to a gate terminal of the transistor M3. The internal clock signal BIT_CLK is input to the gate terminal of the transistor M3 and the gate terminal of the transistor M4. The second power supply voltage VDD2 may be set to a voltage equal to or higher than the first power supply voltage VDD1 supplied to the driving unit 122P and the driving unit 122N of the capacitance DAC circuit 120 due to restriction of an input voltage range of the parallel comparison circuit 130.

A source terminal of the transistor M5 is connected to the ground GND. The ground GND gives a lowest voltage. A drain terminal of the transistor M5 is connected to a source terminal of the transistor M1 and a source terminal of the transistor M2. The internal clock signal BIT_CLK is input to the gate terminal of the transistor M5.

The latch circuit 12 includes a transistor M7, a transistor M8, a transistor M9, a transistor M10, a transistor M11, a transistor M12, a transistor M13, and a transistor M14. The transistor M11, the transistor M12, the transistor M13, and the transistor M14 are N-channel type field-effect transistors. The transistor M7, the transistor M8, the transistor M9, and the transistor M10 are P-channel type field effect transistors. The type of each transistor constituting the latch circuit 12 can be optionally selected under a condition that a latch function of the latch circuit 12 can be obtained.

A gate terminal of the transistor M7 is connected to a drain terminal of the transistor M2. The analog signal AP output from the differential amplifier circuit 11 is input to a gate terminal of the transistor M7. A gate terminal of the transistor M8 is connected to a drain terminal of the transistor M1. The analog signal AN output from the differential amplifier circuit 11 is input to the gate terminal of the transistor M8.

A source terminal of the transistor M9 is connected to the power supply that outputs the second power supply voltage VDD2. A drain terminal of the transistor M9 is connected to a source terminal of the transistor M7. A source terminal of the transistor M10 is connected to the power supply that outputs the second power supply voltage VDD2. A drain terminal of the transistor M10 is connected to a source terminal of the transistor M8.

A source terminal of the transistor M11 is connected to the ground GND. A drain terminal of the transistor M11 is connected to a drain terminal of the transistor M7. A gate terminal of the transistor M11 is connected to a gate terminal of the transistor M9 and a drain terminal of the transistor M8. A source terminal of the transistor M12 is connected to the ground GND. A drain terminal of the transistor M12 is connected to the drain terminal of the transistor M8. A gate terminal of the transistor M12 is connected to a gate terminal of the transistor M10 and the drain terminal of the transistor M7.

A source terminal of the transistor M13 is connected to the ground GND. A drain terminal of the transistor M13 is connected to a drain terminal of the transistor M11. The inverted internal clock signal BIT_CLKb is input to a gate terminal of the transistor M3. A source terminal of the transistor M14 is connected to the ground GND. A drain terminal of the transistor M14 is connected to a drain terminal of the transistor M12. The inverted internal clock signal BIT_CLKb is input to a gate terminal of the transistor M14.

A drain terminal of the transistor M14 is connected to the first output terminal. A drain terminal of the transistor M13 is connected to the second output terminal. The digital signal VOP1 is output from the first output terminal and the digital signal VON1 is output from the second output terminal.

A basic operation of the comparison circuits 131, 132, and 133 will be described. First, an operation when the internal clock signal BIT_CLK is at a low level will be described. When the internal clock signal BIT_CLK is at a low level, the inverted internal clock signal BIT_CLKb is at a high level. Therefore, the transistor M5 of the differential amplifier circuit 11 is turned off, and the transistors M3 and M4 are turned on. The transistor M13 and the transistor M14 of the latch circuit 12 are turned on.

In this case, the potentials of the analog signal AN and the analog signal AP are pulled up to the second power supply voltage VDD2. Since the analog signal AN and the analog signal AP are input to the gate terminals of the transistors M7 and M8, the transistors M7 and M8 are turned off. On the other hand, the transistors M13 and M14 are turned on. The potentials of the digital signal VOP1 and the digital signal VON1 are pulled down to the ground GND via the transistor M13 and the transistor M14.

An operation when the internal clock signal BIT_CLK is switched from a low level to a high level in a state in which the analog signal VCP is greater than the analog signal VCN (VCP>VCN) will be described.

When the internal clock signal BIT_CLK switches from the low level to the high level, the transistor M5 is turned on in the differential amplifier circuit 11. Therefore, a drain current flows through the transistor M5. The transistor M3 and the transistor M4 are turned off. The transistor M1 extracts charge from a parasitic capacitor connected to a node NAN at the drain terminal of the transistor M1. The transistor M2 extracts charge from the parasitic capacitor connected to the node NAP at the drain terminal of the transistor M2.

In the process in which the transistor M1 and the transistor M2 extract the charge from the parasitic capacitor, there is a difference in a speed at which charge is extracted from the parasitic capacitor due to a difference in potential between the analog signal VCP and the analog signal VCN. Since the analog signal VCP is greater than the analog signal VCN (VCP>VCN), a current flowing through the transistor M1 is greater than a current flowing through the transistor M2. As a result, a potential of the analog signal AN decreases faster than a potential of the analog signal AP.

The internal clock signal BIT_CLK changes from the low level to the high level and the inverted internal clock signal BIT_CLKb changes from the high level to the low level. Accordingly, in the latch circuit 12, the potentials of the digital signals VOP1, VOP2, and VOP3 and the digital signals VON1, VON2, and VON3 increase toward the second power supply voltage VDD2. Since the potential of the analog signal AN decreases faster than the potential of the analog signal AP, the transistor M8 is turned on sooner than the transistor M7. Therefore, an increasing speed of the potentials of the digital signals VOP1, VOP2, and VOP3 becomes higher than the increasing speed of the potentials of the digital signals VON1, VON2, and VON3. As a result, the potentials of the digital signals VOP1, VOP2, and VOP3 are pulled up toward the second power supply voltage VDD2.

An inverter formed of the transistors M7, M9, and M11 and an inverter formed of the transistors M8, M10, and M12 are cross-connected. In this case, the transistor M9 in which the digital signals VOP1, VOP2, and VOP3 are applied to the gate terminal is turned off. Therefore, the digital signals VON1, VON2, and VON3 are pulled down toward the ground GND. Therefore, the digital signals VOP1, VOP2, and VOP3 and the digital signals VON1, VON2, and VON3 having logical levels according to a magnitude relationship between the analog signal VCP and the analog signal VCN are output from the comparison circuits 131, 132, and 133.

Specifically, when the analog signal VCP is greater than the analog signal VCN (VCP>VCN), the potentials of the digital signals VOP1, VOP2, and VOP3 become the potential of the second power supply voltage VDD2, and the potentials of the digital signals VON1, VON2, and VON3 become the potential of the ground GND. When the analog signal VCN is greater than the analog signal VCP (VCN>VCP), the potentials of the digital signals VON1, VON2, and VON3 become the potential of the second power supply voltage VDD2 and the potentials of the digital signals VOP1, VOP2, and VOP3 become the potential of the ground GND. Thus, the comparison circuits 131, 132, and 133 output the binary digital signals VOP1, VOP2, and VOP3 and the digital signals VON1, VON2, and VON3 indicating a magnitude relationship between the analog signal VCP and the analog signal VCN.

The comparison circuits 131, 132, and 133 are dynamic comparators. In the dynamic comparison circuits 131, 132, and 133, only a through current due to a change in a state flows as an operating current, as in a CMOS logic. That is, in the dynamic comparison circuits 131, 132, and 133, a current transiently flows only when the signal levels of the internal clock signal BIT_CLK and the inverted internal clock signal BIT_CLKb change from the high level to the low level or from the low level to the high level. A steady state current (an idling current) is not generated. Therefore, the dynamic comparison circuits 131, 132, and 133 are suitable for low power consumption.

Figure 4:
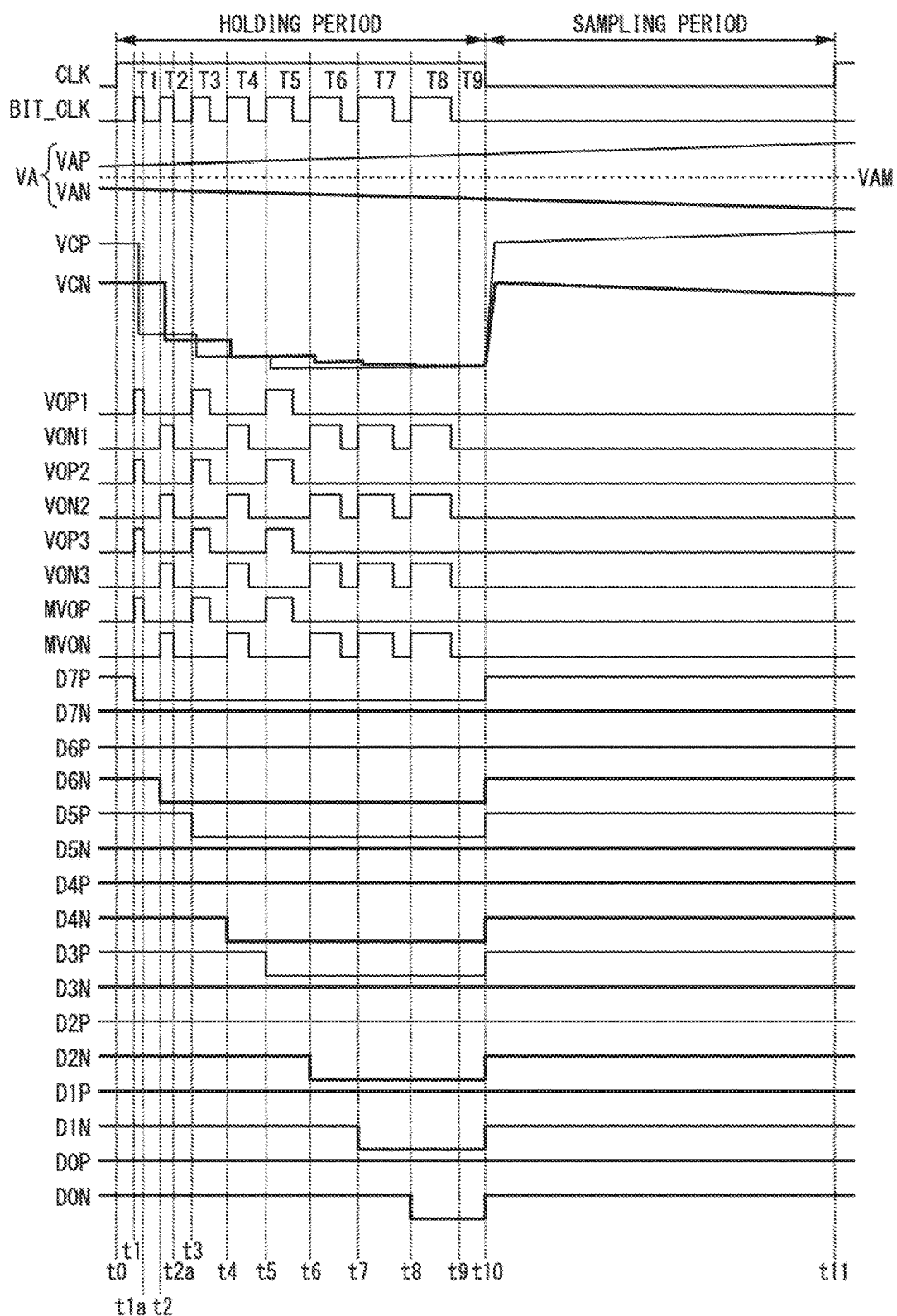
FIG. 4 is a timing chart showing an operation of the A/D conversion circuit according to the first embodiment of the present invention.

The operation (A/D conversion) of the A/D conversion circuit 100 will be described with reference to FIG. 4. FIG. 4 shows signals related to the operation of the A/D conversion circuit 100. In FIG. 4, the clock signal CLK and the internal clock signal BIT_CLK are shown. In FIG. 4, the analog signal VAP, the analog signal VAN, the analog signal VCP, and the analog signal VCN are shown. In FIG. 4, the digital signals VOP1, VOP2, and VOP3, the digital signals VON1, VON2, and VON3, the digital signal MVOP, and the digital signal MVON are shown. In FIG. 4, the reference signals D0P to D0P and the reference signals D0N to D7N are shown. In FIG. 4, a horizontal axis indicates time and a vertical axis indicates a signal level.

When the clock signal CLK is at a low level, the sampling circuit 110 tracks and samples the analog signal VAP and the analog signal VAN input as the differential signal VA into the capacitance DAC circuit 120. The sampling circuit 110 holds the analog signal VAP and the analog signal VAN at a timing when the clock signal CLK changes from the low level to the high level.

Hereinafter, a period in which the clock signal CLK is at a low level is referred to as a sampling period, and a period in which the clock signal CLK is at a high level is referred to as a holding period. The sampling period and the holding period alternately appear. A period from time t0 to time t10 shown in FIG. 4 is the holding period, and a period from time t10 to time t11 is the sampling period. A period before time t0 is the sampling period, and a period after time t11 is the holding period.

In the holding period, the A/D conversion circuit 100 performs A/D conversion of the analog signal VAP and the analog signal VAN sampled by the sampling circuit 110 in the sampling period. Schematically, the A/D conversion circuit 100 sequentially determines a value of each bit of the digital signals D0 to D7 from the most significant bit (D7) to the least significant bit (D0) of the digital signals D0 to D7. The timing is in synchronization with a timing of the internal clock signal BIT_CLK and the inverted internal clock signal BIT_CLKb input from the control circuit 150 in the holding period. Accordingly, the A/D conversion circuit 100 performs A/D conversion of the analog signal VAP and the analog signal VAN held by the sampling circuit 110 to generate the digital signals D0 to D7.

The A/D conversion of the A/D conversion circuit 100 will be described in detail. In the sampling period before time t0 shown in FIG. 4, the clock signal CLK is at the low level. In this case, the switch 110P and the switch 110N of the sampling circuit 110 are on. Therefore, the analog signal VAP and the analog signal VAN are sampled (tracked) by the sampling circuit 110 and output to the capacitance DAC circuit 120. Charge corresponding to the potentials of the analog signal VAP and the analog signal VAN output from the sampling circuit 110 is sampled in the attenuation capacitor CHP and the binary capacitors C0P to C7P of the capacitance DAC circuit 120.

When the sampling period is started, each bit of the digital signals DP0 to DP7 and the digital signals DN0 to DN7 output from the control circuit 150 is set (initialized) to "0."

Therefore, the reference signals D0P to D7P output from the driving unit 122P and the reference signals D0N to D7N output from the driving unit 122N are at the high level. At time t0, the holding period is started by the clock signal CLK changing from the low level to the high level. Accordingly, the switch 110P and the switch 110N of the sampling circuit 110 are turned off. Therefore, the analog signal VAP immediately before the clock signal CLK changes from the low level to the high level is held in the attenuation capacitor CHP and the binary capacitors C0P to C7P of the capacitor circuit 121. The analog signal VAN immediately before the clock signal CLK changes from the low level to the high level is held in the attenuation capacitor CHN and the binary capacitors C0N to C7N of the capacitor circuit 121. The analog signal VAP and the analog signal VAN held as described above are output as the analog signal VCP and the analog signal VCN from the capacitance DAC circuit 120 to the parallel comparison circuit 130.

The parallel comparison circuit 130 sequentially compares the analog signal VCP and the analog signal VCN output from the capacitance DAC circuit 120 under the control of the control circuit 150. An operation in a period T1 from time t1 to time t2 corresponding to a first cycle of the internal clock signal BIT_CLK after time t0 will be described.

At time t0, the analog signal VAP and the analog signal VAN are held in the capacitor circuit 121, and the analog signal VCP and the analog signal VCN are output from the capacitance DAC circuit 120. In this state, the internal clock signal BIT_CLK changes from a low level to a high level at time t1. Accordingly, the latch circuits 12 of the comparison circuits 131, 132, and 133 become active, and the comparison circuits 131, 132, and 133 start to compare the analog signal VCP with the analog signal VCN.

In the example shown in FIG. 4, the signal level of the analog signal VCP at time t1 is higher than the signal level of the analog signal VCN (VCP>VCN). Therefore, the comparison circuits 131, 132, and 133 output high level digital signals VOP1, VOP2, and VOP3 and low level digital signals VON1, VON2, and VON3 as comparison results. The determination circuit 140 outputs the high level digital signal MVOP and the low level digital signal MVON on the basis of the comparison results of the comparison circuits 131, 132, and 133. The control circuit 150 outputs the high level digital signal DP7 and the low level digital signal DN7 on the basis of the digital signal MVOP and the digital signal MVON. Accordingly, the value of the most significant bit (D7) of the digital signals D0 to D7 that are the A/D conversion result is determined. The digital signal DP7 is output as the digital signal D7.

When the digital signal DP7 changes from the low level to the high level, the reference signal D7P from the inverter Q7P of the driving unit 122P to which the digital signal DP7 is input changes from the high level to the low level. Therefore, a voltage between the first terminal and the second terminal of the binary capacitor C7P to which the reference signal D7P from the inverter Q7P is applied changes. Charge redistribution is performed by extracting the charge accumulated in the binary capacitor C7P according to the amount of change in the voltage between the terminals of the binary capacitor C7P. Due to the charge redistribution, the potential of the node NP is lowered to a potential corresponding to the charge extracted from the binary capacitor C7P. Therefore, the signal level of the analog signal VCP given by the potential of the node NP is lowered.

Since the digital signal DN7 is kept at the low level, the reference signal D7N from the inverter Q7N of the driving unit 122N to which the digital signal DN7 is input is kept at the high level. Therefore, the charge of the binary capacitor C7N to which the reference signal D7N from the inverter Q7N is applied does not move. That is, the potential of the node NN does not change. Therefore, the signal level of the analog signal VCN given by the potential of the node NN does not change.

At time t1a, the internal clock signal BIT_CLK becomes a low level and the inverted internal clock signal BIT_CLKb becomes a high level. Accordingly, the latch circuits 12 of the comparison circuits 131, 132, and 133 become inactive. In this case, the latch circuits 12 of the comparison circuits 131, 132, and 133 output low level digital signals VOP1, VOP2, and VOP3 and digital signals VON1, VON2, and VON3.

The operation in a period T2 from time t2 to time t3 corresponding to a second cycle of the internal clock signal BIT_CLK will be described.

As described above, the analog signal VAP and the analog signal VAN are held in the capacitance DAC circuit 120, and the analog signal VCP and the analog signal VCN are output from the capacitance DAC circuit 120. In this state, the internal clock signal BIT_CLK changes from the low level to the high level and the inverted internal clock signal BIT_CLKb changes from the high level to the low level at time t2. Accordingly, the latch circuits 12 of the comparison circuits 131, 132, and 133 become active, and the comparison circuits 131, 132, and 133 start to compare the analog signal VCP with the analog signal VCN.

In the example shown in FIG. 4, the signal level of the analog signal VCP at time t2 is lower than the signal level of the analog signal VCN (VCP<VCN). Therefore, the comparison circuits 131, 132, and 133 output low level digital signals VOP1, VOP2, and VOP3 and high level digital signals VON1, VON2, and VON3 as comparison results. The determination circuit 140 outputs the low level digital signal MVOP and the high level digital signal MVON on the basis of the comparison results of the comparison circuits 131, 132, and 133. The control circuit 150 outputs a low level digital signal DP6 and a high level digital signal DN6 on the basis of the digital signal MVOP and the digital signal MVON. Accordingly, a value of the second bit (D6) from the most significant bit among the digital signals D0 to D7 after the A/D conversion is determined. The digital signal DP6 is output as the digital signal D6.

When the digital signal DN6 changes from the low level to the high level, a reference signal D6N from the inverter Q6N of the driving unit 122N to which the digital signal DN6 is input changes from the high level to the low level. Therefore, a voltage between the first terminal and the second terminal of a binary capacitor C6N to which the reference signal D6N from the inverter Q6N is applied changes. Charge redistribution is performed by extracting the charge accumulated in the binary capacitor C6N according to the amount of change in the voltage between the terminals of the binary capacitor C6N. Due to the charge redistribution, the potential of the node NN is lowered to a potential corresponding to the charge extracted from the binary capacitor C6N. Therefore, the signal level of the analog signal VCN given by the potential of the node NN decreases.

Since the digital signal DP6 is kept at the low level, a reference signal D6P from the inverter Q6P of the driving unit 122P to which the digital signal DP6 is input is kept at the high level. Therefore, charge of a binary capacitor C6P to which the reference signal D6P from the inverter Q6P is applied does not move. That is, the potential of the node NP does not change. Therefore, the signal level of the analog signal VCP given by the potential of the node NP does not change.

At time t2a, the internal clock signal BIT_CLK becomes a low level and the inverted internal clock signal BIT_CLKb becomes a high level. Accordingly, the latch circuits 12 of the comparison circuits 131, 132, and 133 become inactive. In this case, the latch circuits 12 of the comparison circuits 131, 132, and 133 output low level digital signals VOP1, VOP2, and VOP3 and digital signals VON1, VON2, and VON3.

In the period T3 to the period T8 after time t3, the same operation as the above-described operation in the period T1 or the period T2 is performed. That is, successive approximation is performed from the period T3 to the period T8. As a result, values of a third bit (D5) to a least significant bit (D0) of the digital signals D0 to D7 are determined. As a result, digital signals D0 to D7 in which values of all bits are determined by A/D conversion are obtained.

In a period T8, the least significant bit (D0) is determined. In a period T9, the control circuit 150 outputs the digital signals D0 to D7 finally obtained by the A/D conversion from the output terminal.

At time t10 at which the period T9 ends, the clock signal CLK changes from the high level to the low level, and accordingly, the holding period ends and the sampling period starts. Accordingly, the switch 110P and the switch 110N of the sampling circuit 110 are turned on. Therefore, the analog signal VAP and the analog signal VAN are sampled (tracked) by the sampling circuit 110 and output to the capacitance DAC circuit 120. Charge corresponding to the potentials of the analog signal VAP and the analog signal VAN output from the sampling circuit 110 is sampled in the attenuation capacitors CHP and CHN and the binary capacitors C0P to C7P and C0N to C7N of the capacitance DAC circuit 120.

When the sampling period is started, each bit of the digital signals DP0 to DP7 and the digital signals DN0 to DN7 output from the control circuit 150 is set (initialized) to "0". Therefore, the reference signals D0P to D7P output from the driving unit 122P and the reference signals D0N to D7N output from the driving unit 122N are at the high level. Thereafter, at time t11, the clock signal CLK changes from the low level to the high level, and accordingly, the sampling period ends and the holding period starts.

Figure 5:
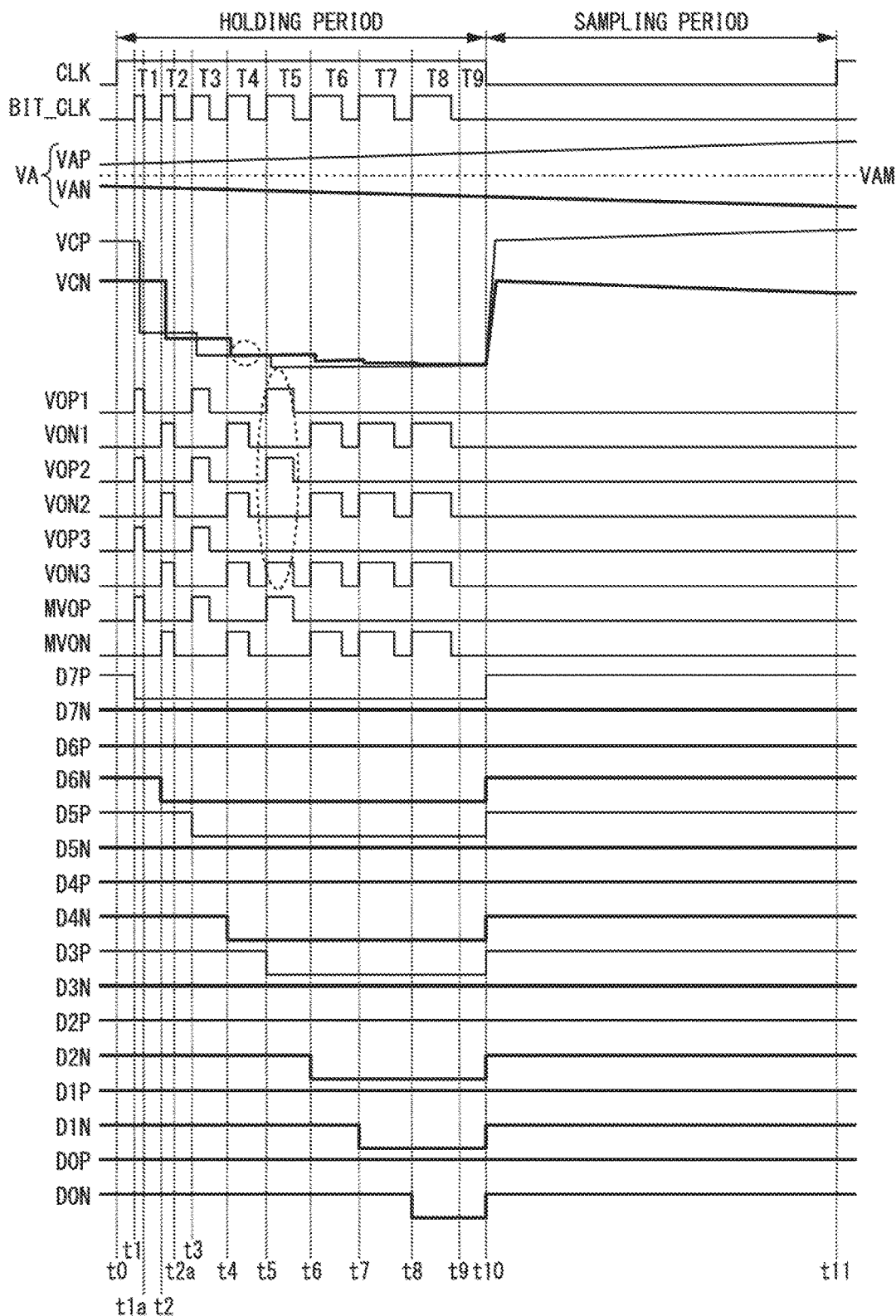
FIG. 5 is a timing chart showing the operation of the A/D conversion circuit according to the first embodiment of the present invention.

The operation of the determination circuit 140 will be described in detail with reference to FIG. 5. FIG. 5 shows signals regarding the operation of the A/D conversion circuit 100. In FIG. 5, signals other than the signals in the period T5 are the same as the signals shown in FIG. 4.

The comparison circuits 131, 132, and 133 are influenced by noise of randomness. For example, this noise is fluctuation of the second power supply voltage VDD2, external noise superimposed on the analog signal, thermal noise of the comparison circuits 131, 132, and 133, and KTC noise of the sampling circuit 110. Even when the sources of noise are the same, the amount of noise differs due to an influence of a parasitic element in the course of noise propagating to the comparison circuits 131, 132, and 133. The parasitic element is a wiring resistor, a wiring capacitor, and the like. When the above noise is not generated, the digital signals generated by the respective comparison circuits 131, 132, and 133 are consistent. That is, all the logic levels of the digital signals VOP1, VOP2, and VOP3 are coincident and all the logic levels of the digital signals VON1, VON2, and VON3 are coincident. In particular, when the values of the analog signal VCP and the analog signal VCN are substantially the same and the above noise is generated, consistency of the digital signals generated by the respective comparison circuits 131, 132, and 133 is lost.

In the period T5 shown in FIG. 5, the consistency of the digital signals generated by the respective comparison circuits 131, 132, and 133 is lost. In the period T5, the digital signal VOP1 from the comparison circuit 131 and the digital signal VOP2 from the comparison circuit 132 become a high level, but the digital signal VOP3 from the comparison circuit 133 becomes a low level. The digital signal VON1 from the comparison circuit 131 and the digital signal VON2 from the comparison circuit 132 are at a low level but the digital signal VON3 from the comparison circuit 133 is at a high level. Therefore, the comparison results of the comparison circuit 131 and the comparison circuit 132 are different from the comparison result of the comparison circuit 133.

The determination circuit 140 determines the comparison result through majority determination of the digital signals VOP1, VOP2, and VOP3 and the digital signals VON1, VON2, and VON3 output from the comparison circuits 131, 132, and 133. The determination circuit 140 counts a first number with respect to the digital signals VOP1, VOP2, and VOP3 output from the comparison circuits 131, 132, and 133. The determination circuit 140 counts a second number with respect to the digital signals VON1, VON2, and VON3 output from the comparison circuits 131, 132, and 133. The first number and the second number are the number of high level signals. In the period T5, since the digital signal VOP1 and the digital signal VOP1 become a high level, the first number is 2. In the period T5, since only the digital signal VON3 becomes a high level, the second number is 1.

The determination circuit 140 selects a comparison result corresponding to any one of the first number and the second number on the basis of the first number and the second number and generates a digital signal MVOP and a digital signal MVON corresponding to the selected comparison result. The determination circuit 140 selects the comparison result based on the digital signal corresponding to the greater number. When the first number is greater than the second number, the determination circuit 140 selects the comparison result based on the digital signal of which the first number has been counted. When the second number is greater than the first number, the determination circuit 140 selects the comparison result based on the digital signal of which the second number has been counted. In the period T5, the first number, that is, 2 is greater than the second number, that is, 1. Therefore, the determination circuit 140 selects the comparison result based on the digital signal VOP1 and the digital signal VOP2 of which the first number has been counted. The digital signal VOP1 and the digital signal VOP2 are at the high level and the digital signal VON1 and the digital signal VON2 are at the low level. Therefore, the determination circuit 140 generates the high level digital signal MVOP and the low level digital signal MVON.

The above content is equivalent to the following content. Only one of the two digital signals constituting one set of digital signals becomes a high level such that the set of digital signals can indicate one of the first state and the second state. In the first state, the signal level of the analog signal VCP is higher than the signal level of the analog signal VCN. In the second state, the signal level of the analog signal VCP is lower than the signal level of the analog signal VCN. The first number indicates the number of the first state. The second number indicates the number of the second state. The determination circuit 140 selects one of the first state and the second state on the basis of the first number and the second number and generates the digital signal MVOP and the digital signal MVON corresponding to the selected state. The determination circuit 140 selects the state corresponding to a greater number. When the first number is greater than the second number, the determination circuit 140 selects the first state. When the second number is greater than the first number, the determination circuit 140 selects the second state. In the period T5, the first number, that is, 2 is greater than the second number, that is, 1. Therefore, the determination circuit 140 selects the first state corresponding to the first number. The determination circuit 140 generates a high level digital signal MVOP and a low level digital signal MVON corresponding to the first state.

The A/D conversion circuit 100 can more accurately determine a relationship between the magnitudes of the analog signal VCP and the analog signal VCN, as compared with the case in which the parallel comparison circuit 130 includes only one comparison circuit.

In each of the period T1 to the period T4 and the period T6 to the period T8, all the logical levels of the digital signals VOP1, VOP2, and VOP3 are coincident and all the logical levels of the digital signals VON1, VON2, and VON3 are coincident. In these periods, one of the first number and the second number is 3 and the other of the first number and the second number is 0. In these periods, the determination circuit 140 generates the digital signal MVOP and the digital signal MVON through the same process as the above process.

The determination circuit 140 may count only one of the first number and the second number. For example, the determination circuit 140 counts only the first number. The determination circuit 140 determines whether or not the first number equal to or greater than 2. When the first number is equal to or greater than 2, the determination circuit 140 selects the comparison result based on the digital signal of which the first number has been counted. When the first number is smaller than 2, the determination circuit 140 selects a comparison result based on the digital signal of which the second number has been counted. For example, in the period T5, the first number is 2. Therefore, the determination circuit 140 selects a comparison result based on the digital signal VOP1 and the digital signal VOP2 of which the first number has been counted. Similarly, the determination circuit 140 may count only the second number.

As described above, the A/D conversion circuit 100 (the successive approximation type A/D conversion circuit) includes at least a capacitor unit 121P (a first capacitor circuit), a capacitor unit 121N (a second capacitor circuit), a plurality of comparison circuits 131, 132, and 133, a determination circuit 140, and a control circuit 150. The capacitor unit 121P includes a plurality of binary capacitors C0P to C7P (first capacitors) having weighted capacitance values. The analog signal VAP (first analog signal) is input to the capacitor unit 121P. The capacitor unit 121N includes a plurality of binary capacitors C0N to C7N (second capacitors) having weighted capacitance values. The analog signal VAN (the second analog signal) is input to the capacitor unit 121N. The analog signal VAP and the analog signal VAN constitute a differential signal VA. The plurality of comparison circuits 131, 132, and 133 are connected to the node NP (first output node) of the capacitor unit 121P and the node NN (second output node) of the capacitor unit 121N. The plurality of comparison circuits 131, 132, and 133 compare the potentials of the node NP and the node NN and output the digital signals VOP1, VOP2, VOP3, VON1, VON2, and VON3 (first digital signal). The digital signals VOP1, VOP2, VOP3, VON1, VON2, and VON3 indicate one of the first state and the second state. In the first state, the potential of the node NP is higher than the potential of the node NN. In the second state, the potential of the node NP is lower than the potential of the node NN. The determination circuit 140 counts the number of at least one of the first state and the second state with respect to the plurality of digital signals VOP1, VOP2, VOP3, VON1, VON2, and VON3 output from the plurality of comparison circuits 131, 132, and 133. The determination circuit 140 generates digital signals MVOP and MVON (second digital signal) indicating the comparison result on the basis of the counted number. On the basis of the digital signals MVOP and MVON, the control circuit 150 generates digital signals D0 to D7 (third digital signals) corresponding to the analog signal VAP and the analog signal VAN. The control circuit 150 controls the capacitor unit 121P or the capacitor unit 121N on the basis of the digital signals MVOP and MVON.

The A/D conversion circuit of each aspect of the present invention need not include a configuration corresponding to the driving circuit 122. The A/D conversion circuit of each aspect of the present invention need not include capacitors corresponding to the attenuation capacitor CHP and the attenuation capacitor CHN.

In the A/D conversion circuit 100 of the first embodiment, the determination circuit 140 counts the number of at least one of the first state and the second state and generates digital signals MVOP and MVON indicating the comparison result on the basis of the counted number. Accordingly, the digital signals MVOP and MVON based on the comparison results of the comparison circuits 131, 132, and 133 in a comprehensive manner are generated. Therefore, the accuracy of the A/D conversion is improved.

Second Embodiment

A second embodiment will be described using the A/D conversion circuit 100 of the first embodiment. The determination circuit 140 counts a first number of first states and a second number of second states with respect to the plurality of digital signals VOP1, VOP2, and VOP3, VON1, VON2, and VON3 output from the plurality of comparison circuits 131, 132, and 133. When an absolute value of a difference between the first number and the second number is equal to or smaller than 1, the determination circuit 140 outputs a control signal for stopping the plurality of comparison circuits 131, 132, and 133 to the control circuit 150. The control circuit 150 stops the plurality of comparison circuits 131, 132, and 133 on the basis of the control signal.

An operation of the A/D conversion circuit 100 will be described in detail with reference to FIG. 5. The operation from a period T1 to a period T4 is the same as the operation in the first embodiment.

In a period T5, the determination circuit 140 counts the first number with respect to the digital signals VOP1, VOP2, and VOP3 output from the comparison circuits 131, 132, and 133. The determination circuit 140 counts the second number with respect to the digital signals VON1, VON2, and VON3 output from the comparison circuits 131, 132, and 133. The first number and the second number are the number of high level signals. In the period T5, since the digital signal VOP1 and the digital signal VOP2 become a high level, the first number is 2. In the period T5, since only the digital signal VON3 becomes a high level, the second number is 1.

The determination circuit 140 compares the first number and the second number. Since the first number is greater than the second number, the determination circuit 140 selects a comparison result based on the digital signal VOP1 and the digital signal VOP2 of which the first number been counted. The digital signal VOP1 and the digital signal VOP2 are at the high level and the digital signal VON1 and the digital signal VON2 are at the low level. Therefore, the determination circuit 140 generates the high level digital signal MVOP and the low level digital signal MVON. The above operation in the period T5 is the same as the operation in the first embodiment.

The determination circuit 140 calculates the absolute value of the difference between the first number and the second number. The determination circuit 140 determines whether or not the calculated absolute value of the difference is 1. Since the first number is 2 and the second number is 1, the absolute value of the difference between the first number and the second number is 1. When the calculated absolute value of the difference is 1, the determination circuit 140 outputs a control signal to the control circuit 150. When the period T5 ends, the control circuit 150 stops the plurality of comparison circuits 131, 132, and 133 on the basis of the control signal from the determination circuit 140. When the period T5 ends, the control circuit 150 further stops the determination circuit 140. The digital signal MVOP and the digital signal MVON output from the determination circuit 140 are fixed to a level opposite to the level of each signal in the period T5. That is, the digital signal MVOP is fixed to the low level and the digital signal MVON is fixed to the high level. In the period T6 to the period T8, the determination circuit 140 generates the digital signals D2 to D0 on the basis of the fixed digital signal MVOP and the fixed digital signal MVON. In the period T6 to the period T8, the determination circuit 140 controls the capacitor unit 121N on the basis of the digital signal MVOP and the digital signal MVON.

When the absolute value of the difference between the first number and the second number is 1, consistency of the digital signal generated by each of the comparison circuits 131, 132, and 133 is lost due to an influence of noise. Therefore, the determination circuit 140 can determine that the analog signal VCP and the analog signal VCN gradually approach each other. After the analog signal VCP and the analog signal VCN gradually approach each other in the holding period, the analog signal VCP and the analog signal VCN do not gradually approach each other again in the holding period. A comparison result after the analog signal VCP and the analog signal VCN gradually approach each other is known from an operating principle. Therefore, the control circuit 150 stops the comparison circuits 131, 132, and 133 from the period T6 to the period T8. In the period T1 to the period T4, since the absolute value of the difference between the first number and the second number is 3, the determination circuit 140 does not generate the control signal.

In the A/D conversion circuit 100 of the second embodiment, when the absolute value of the difference between the first number and the second number is 1, the control circuit 150 stops the plurality of comparison circuits 131, 132, and 133. Accordingly, power consumption of the A/D conversion circuit 100 is reduced.

Third Embodiment

Figure 6:
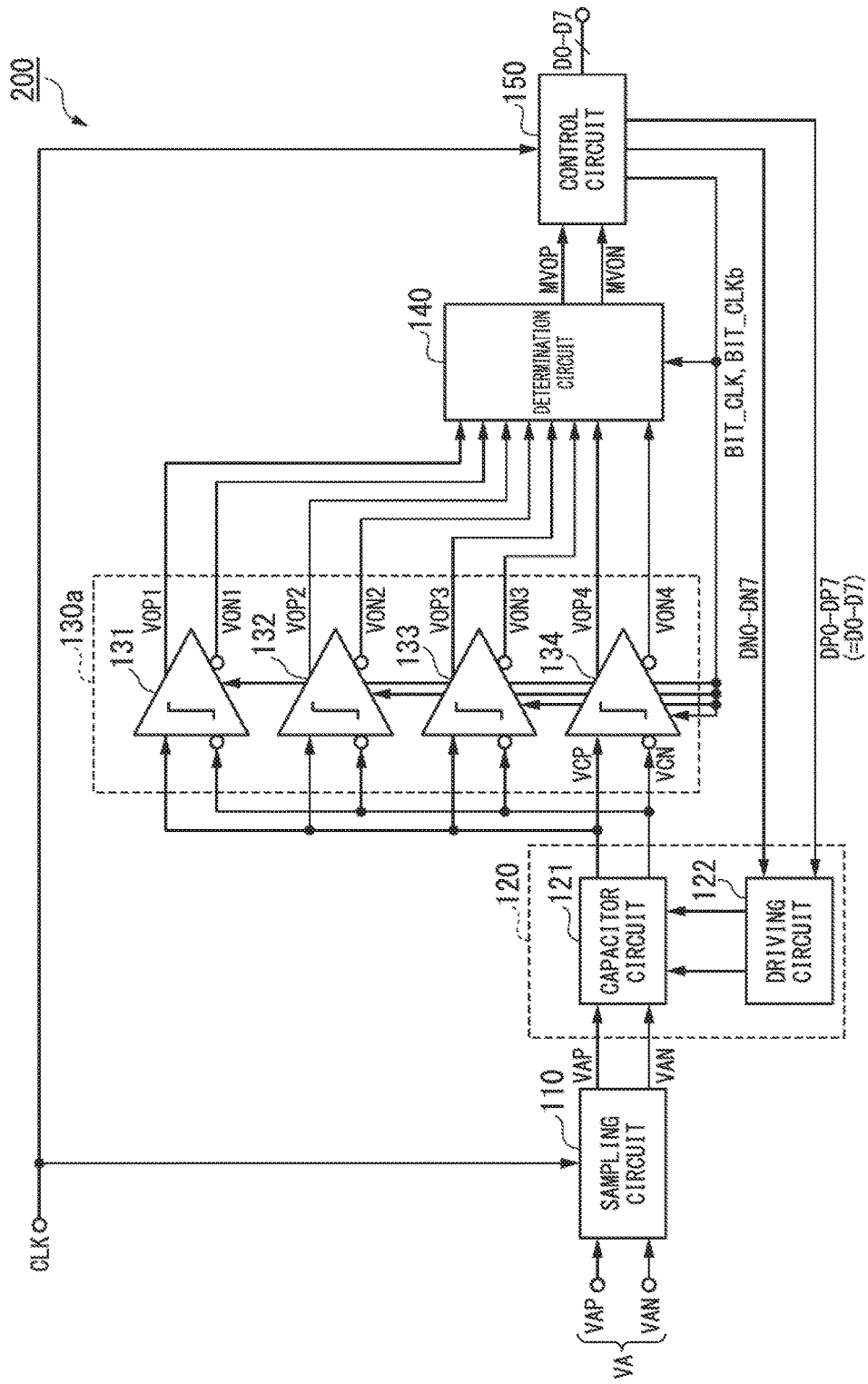
FIG. 6 is a block diagram showing a configuration of an A/D conversion circuit according to a third embodiment of the present invention.

FIG. 6 shows a configuration of an A/D conversion circuit 200 according to the third embodiment of the present invention. The A/D conversion circuit 200 is a successive approximation type A/D conversion circuit. Differences between the configuration shown in FIG. 6 and the configuration shown in FIG. 1 will be described.

In the A/D conversion circuit 200, the parallel comparison circuit 130 in the A/D conversion circuit 100 shown in FIG. 1 is changed to a parallel comparison circuit 130a. The parallel comparison circuit 130a includes a plurality of comparison circuits. In the A/D conversion circuit 200 of the third embodiment, the plurality of comparison circuits are an even number of two or more comparison circuits. The parallel comparison circuit 130a shown in FIG. 6 includes four comparison circuits 131, 132, 133, and 134. The comparison circuits 131, 132, 133, and 134 are connected to the capacitance DAC circuit 120 and the determination circuit 140. The configuration of the comparison circuit 134 is the same as that of the comparison circuits 131, 132, and 133. The comparison circuit 134 outputs a digital signal VOP4 and a digital signal VON4 indicating a comparison result.

The determination circuit 140 counts the first number of the first state and the second number of the second state of four sets of digital signals output from the four comparison circuits 131, 132, 133, and 134. As described above, the comparison circuits 131, 132, 133, and 134 are influenced by random noise. A probability of occurrence of noise in each comparison circuit is approximately equal. A noise generation timing in each comparison circuit is random. Therefore, a timing at which the digital signals VOP1, VOP2, VOP3, and VOP4 and the digital signals VON1, VON2, VON3, and VON4 change to the high level is based on the noise generation timing.

The determination circuit 140 detects a timing at which each of digital signals from the comparison circuits 131, 132, 133, and 134 changes to the high level in the period corresponding to each bit of the digital signals D0 to D7. The determination circuit 140 increases the first number or the second number at the timing. The determination circuit 140 generates a digital signal MVOP and a digital signal MVON indicating a state corresponding to the number that becomes equal to or greater than 2 earlier between the first number and the second number. For example, when the first number becomes equal to or greater than 2 earlier than the second number, the determination circuit 140 generates the digital signal MVOP and the digital signal MVON indicating the first state. When the second number becomes equal to or greater than 2 earlier than the first number, the determination circuit 140 generates the digital signal MVOP and the digital signal MVON indicating the second state. In this operation, the determination circuit 140 functions as a majority determination circuit. In the comparison circuits 131, 132, 133, and 134, a time required for settlement of a determination result is proportional to the amount of noise. In a comparison circuit with a shorter time required for settlement of the determination result, the amount of noise is smaller. That is, reliability of the comparison result of the comparison circuit in which a change in the digital signal is earlier is higher. Therefore, the determination circuit 140 generates the digital signal MVOP and the digital signal MVON indicating the state corresponding to the number that becomes equal to or greater than 2 earlier between the first number and the second number.

Regarding the points other than the above, the configuration shown in FIG. 6 is the same as the configuration shown in FIG. 1.

Figure 7:
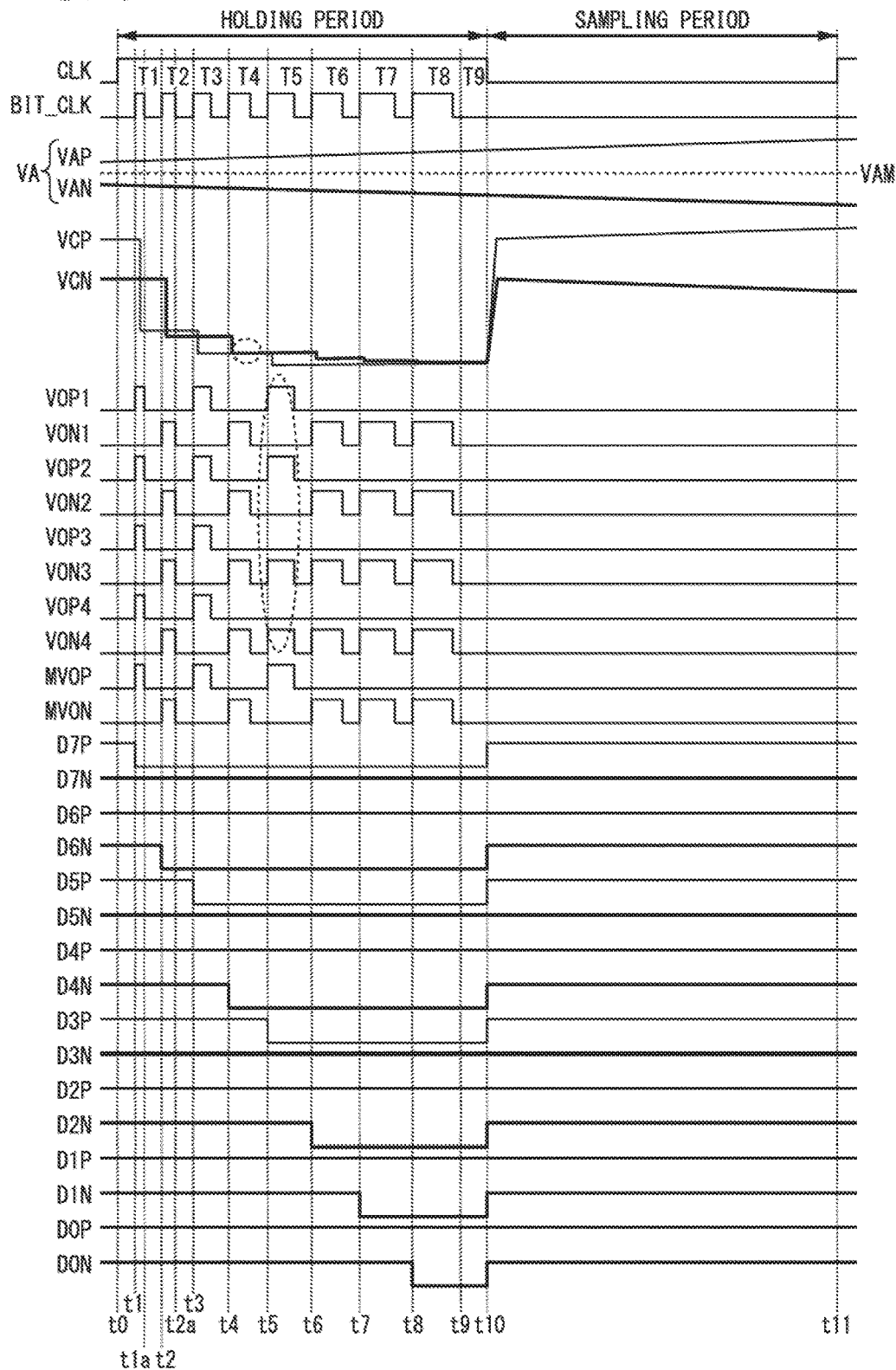
FIG. 7 is a timing chart showing an operation of the A/D conversion circuit according to the third embodiment of the present invention.

An operation (A/D conversion) of the A/D conversion circuit 200 will be described with reference to FIGS. 7 and 8. FIG. 7 shows signals regarding the operation of the A/D conversion circuit 200. In FIG. 7, a digital signal VOP4 and a digital signal VON4 are added to the signal shown in FIG. 4.

Figure 8:
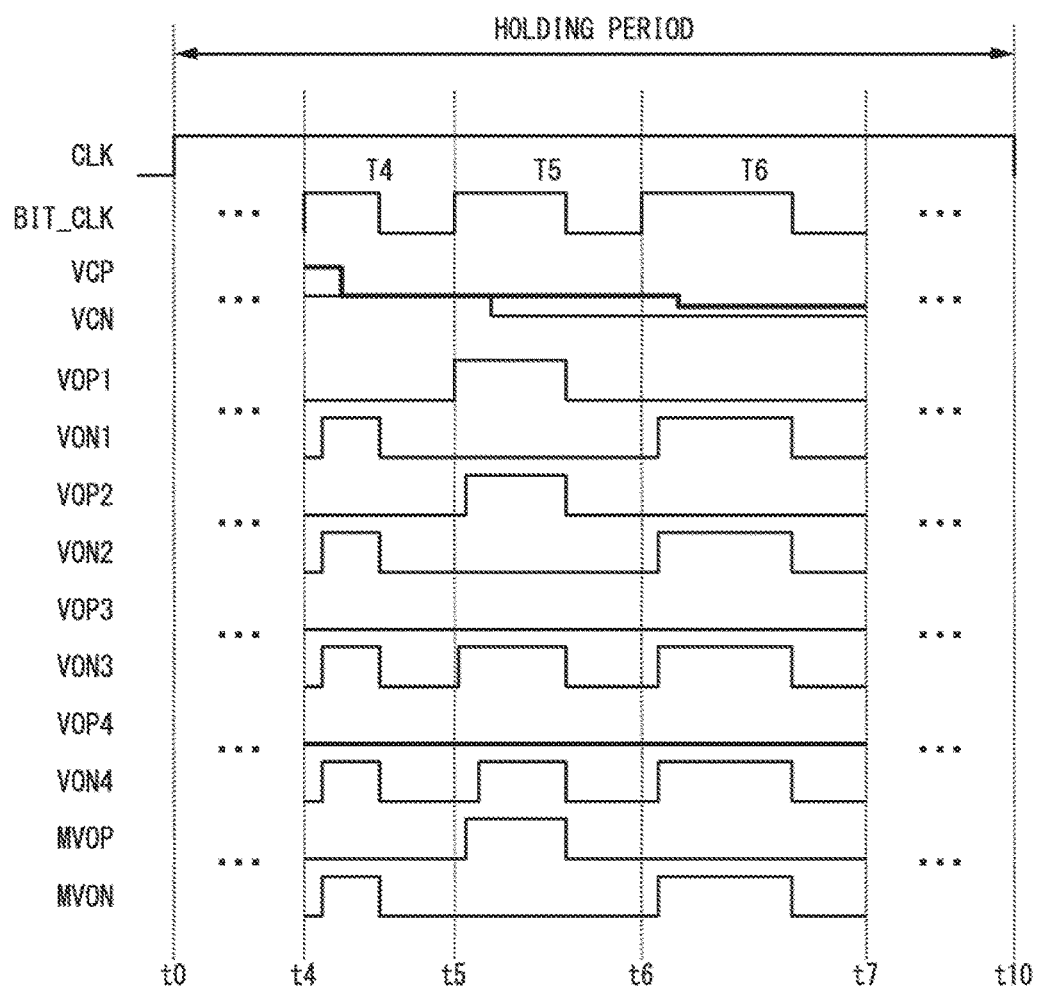
FIG. 8 is a timing chart showing the operation of the A/D conversion circuit according to the third embodiment of the present invention.

FIG. 8 shows signals regarding the operation of the A/D conversion circuit 200 from the period T4 to the period T6. In FIG. 8, a clock signal CLK and an internal clock signal BIT_CLK are shown. In FIG. 8, an analog signal VCP and an analog signal VCN are shown. In FIG. 8, the digital signals VOP1, VOP2, VOP3, and VOP4, the digital signals VON1, VON2, VON3, and VON4, the digital signal MVOP, and the digital signal MVON are shown. In FIG. 8, a horizontal axis indicates time and a vertical axis indicates a signal level.

In the period T5, the determination circuit 140 counts a first number with respect to the digital signals VOP1, VOP2, VOP3, and VOP4 output from the comparison circuits 131, 132, 133, and 134. The determination circuit 140 counts a second number with respect to the digital signals VON1, VON2, and VON3, and VON4 output from the comparison circuits 131, 132, 133, and 134. The first number and the second number are the number of high level signals.

In the period T5, the digital signal VOP1 becomes the high level earliest. In this case, the first number is 1 and the second number is 0. Thereafter, the digital signal VON3 becomes a high level. In this case, the first number and the second number are 1. Thereafter, the digital signal VOP2 becomes a high level. In this case, the first number is 2 and the second number is 1. Since the first number equal to or greater than 2, the determination circuit 140 generates a high level digital signal MVOP and a low level digital signal MVON. Thereafter, the digital signal VON4 becomes a high level. The digital signal VON4 which becomes a high level latest is not used for generation of the digital signal MVOP and the digital signal MVON.

From the period T1 to the period T4 and from the period T6 to the period T8, the determination circuit 140 performs the same operation as the above operation. In these periods, when the comparison circuits 131, 132, 133, and 134 are not influenced by noise, the digital signals VOP1, VOP2, VOP3, and VOP4 become a high level substantially at the same time, or the digital signals VON1, VON2, VON3, and VON4 become a high level substantially at the same time.

In a case in which the parallel comparison circuit 130a includes n comparison circuits, the determination circuit 140 outputs a digital signal MVOP and a digital signal MVON indicating a state corresponding to a number that becomes equal to or greater than n/2 earlier between the first number and the second number. n is an even number of 2 or more.

As in the second embodiment, when the absolute value of the difference between the first number and the second number is equal to or smaller than 1, the determination circuit 140 may output a control signal for stopping the plurality of comparison circuits 131, 132, 133, and 134 to the control circuit 150. In the third embodiment in which the number of comparison circuits is an even number, when the difference between the first number and the second number is 0, the analog signal VCP and the analog signal VCN gradually approach each other. When the difference between the first number and the second number is 0, the determination circuit 140 outputs a control signal for stopping the plurality of comparison circuits 131, 132, 133, and 134 to the control circuit 150.

As described above, the determination circuit 140 generates the digital signal MVOP and the digital signal MVON indicating the state corresponding to the number that becomes equal to or greater than 2 earlier between the first number and the second number. As a result, the digital signals MVOP and MVON based on the comparison results of the comparison circuits 131, 132, 133, and 134 in a comprehensive manner are generated. Therefore, accuracy of the A/D conversion is improved.

While preferred embodiments of the invention have been described and shown above, it should be understood that these are exemplars of the invention and are not to be considered as limiting. Additions, omissions, substitutions, and other modifications can be made without departing from the spirit or scope of the present invention. Accordingly, the invention is not to be considered as being limited by the foregoing description and is only limited by the scope of the appended claims.

What is claimed is:

1. A successive approximation type A/D conversion circuit, comprising:
   a first capacitor circuit including a plurality of first capacitors having weighted capacitance values and to which a first analog signal is input;
   a second capacitor circuit including a plurality of second capacitors having weighted capacitance values and to which a second analog signal is input, the first analog signal and the second analog signal constituting a differential signal;
   a plurality of comparison circuits that are connected to a first output node of the first capacitor circuit and a second output node of the second capacitor circuit, configured to compare a potential of the first output node with a potential of the second output node, and output a first digital signal, the first digital signal indicating any one of a first state and a second state, the potential of the first output node being higher than the potential of the second output node in the first state, and the potential of the first output node being lower than the potential of the second output node in the second state;
   a determination circuit configured to count a number of at least one of the first state and the second state with respect to the plurality of first digital signals output from the plurality of comparison circuits and generate a second digital signal indicating a comparison result on the basis of the counted number; and
   a control circuit configured to generate a third digital signal corresponding to the first analog signal and the second analog signal on the basis of the second digital signal and control the first capacitor circuit or the second capacitor circuit on the basis of the second digital signal,
   wherein the determination circuit is configured to count a first number of the first state and a second number of the second state with respect to the plurality of first digital signals output from the plurality of comparison circuits,
   the determination circuit is configured to output a control signal for stopping the plurality of comparison circuits to the control circuit when an absolute value of a difference between the first number and the second number is equal to or smaller than 1, and
   the control circuit is configured to stop the plurality of comparison circuits on the basis of the control signal.

2. The successive approximation type A/D conversion circuit according to claim 1, wherein the plurality of comparison circuits are an odd number of three or more comparison circuits.

3. The successive approximation type A/D conversion circuit according to claim 1, wherein the determination circuit is configured to generate the second digital signal indicating a state corresponding to a number that becomes equal to or greater than 2 earlier between the first number and the second number.

* * * * *